United States Patent [19]

Takemae

[11] Patent Number: 5,307,316
[45] Date of Patent: Apr. 26, 1994

[54] SEMICONDUCTOR MEMORY UNIT HAVING REDUNDANT STRUCTURE

[75] Inventor: Yoshihiro Takemae, Kawasaki, Japan

[73] Assignee: Fujitsu Limited, Kawasaki, Japan

[21] Appl. No.: 861,822

[22] PCT Filed: Oct. 16, 1991

[86] PCT No.: PCT/JP91/01406
§ 371 Date: Jun. 16, 1992
§ 102(e) Date: Jun. 16, 1992

[87] PCT Pub. No.: WO92/07362
PCT Pub. Date: Apr. 30, 1992

[30] Foreign Application Priority Data
Oct. 16, 1990 [JP] Japan .................................. 2-276889

[51] Int. Cl.$^5$ .............................................. G11C 7/00
[52] U.S. Cl. ............................ 365/200; 365/230.03; 365/230.06
[58] Field of Search ............... 365/200, 230.03, 230.06

[56] References Cited
U.S. PATENT DOCUMENTS 4,849,939 7/1989 Muranaka et al. ......... 365/230.01 X
5,033,024 7/1991 O'Connell et al. ............ 365/200 X
5,140,597 8/1992 Araki .............................. 365/200 X

FOREIGN PATENT DOCUMENTS

58-208998 12/1983 Japan .
59-119743 7/1984 Japan .
60-137000 7/1985 Japan .
62-200599 9/1987 Japan .

Primary Examiner—Eugene R. LaRoche
Assistant Examiner—Do Hyun Yoo
Attorney, Agent, or Firm—Staas & Halsey

[57] ABSTRACT

A semiconductor memory device has a plurality of main memory blocks formed on a chip and each having a redundancy, a sub-memory block formed on the chip and having a substantially identical construction as that of each main memory block, a defect address memory circuit for storing address data of the main memory block that cannot be saved by the redundancy, and a redundancy control circuit for selecting the sub-memory block when a defective main memory block is selected.

9 Claims, 6 Drawing Sheets

SEMICONDUCTOR MEMORY UNIT HAVING REDUNDANT STRUCTURE

FIELD OF THE INVENTION

The present invention generally relates to semiconductor memory devices and, more particularly, to a semiconductor memory device that has a redundancy.

A semiconductor memory device having a redundant construction includes redundant memories in the form of redundant word lines. Such a construction guarantees the normal operation of the memory device as a whole even when a defective memory cell is addressed, by addressing a redundant memory cell in place of the defective memory cell. Such a redundant construction is essential for constructing large scale semiconductor memory devices. In a typical example, the redundant memory cells are provided adjacent to a memory cell array with a number corresponding to two or three word lines. There, a redundant word line is selected when a selected word line contains a defective memory cell. Similarly, the redundant memory cells may be formed in the form of two or three bit lines.

Meanwhile, the large scale semiconductor memory devices having a storage capacity exceeding 4-16 Mbits are generally formed on a chip in the form of a plurality of blocks each having a storage capacity of about 1 Mbits. By doing so, one can reduce the driving power at the time of access. Further, such a construction facilitates a quick selection of the word line or bit line. It should be noted that the parasitic capacitance of the word line or the bit line, caused as a result of a single word line or a single bit line being connected with a large number of memory cells, can be decreased significantly by constructing the device as such. Thereby, the foregoing reduction in the driving power or the reduction in the access time is achieved.

STATE OF THE RELATED ART

Figure 1:
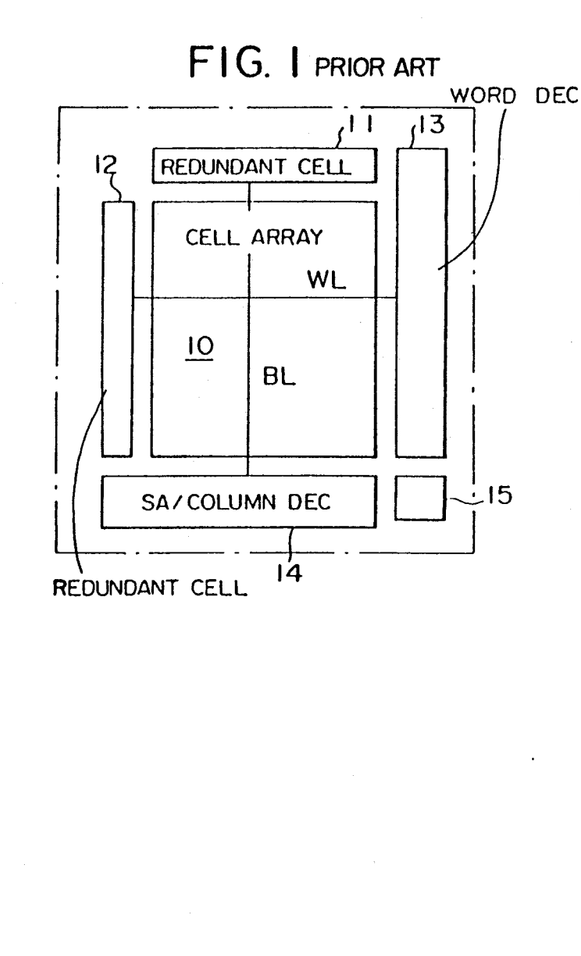
FIG. 1 is a block diagram showing the construction of a conventional semiconductor memory device that has a redundancy.

FIG. 1 shows a conventional semiconductor memory device that has the redundant construction.

Referring to FIG. 1, the semiconductor memory device includes a memory cell array 10 that includes therein a number of memory cells arranged into a row and column formation, a plurality of word lines WL each connected to the memory cells aligned in a row, a plurality of bit lines BL each connected to the memory cells aligned in a row, a plurality of bit lines BL each connected to the memory cells aligned in a column, a word decoder 13 supplied with address data for selecting a word line, and a sense amplifier/column decoder unit 14 that is supplied with address data for selecting a bit line. In addition, the semiconductor memory device includes a first redundant cell array 11 that is provided adjacent to the memory cell array 10 to extend in the direction of the word lines and a second redundant cell array 12 that is provided also adjacent to the memory cell array 10 to extend in the direction of the bit lines.

As usual, a memory cell that corresponds to the intersection between a selected word line WL and a selected bit line BL is selected in response to the selection of the word line WL and the bit line BL by means of the word decoder 13 and the column decoder 14. In this state, the writing or reading of the data is achieved via the sense amplifier/column decoder 14.

The redundant array 11 includes memory cells, aligned in the row direction, of a number corresponding to two or three word lines. There, the word decoder 13 selects a row of the memory cells that are included in the redundant cell array 11 when the selected word line of the array 10 includes a defective memory cell. Similarly, the redundant array 12 includes memory cells, aligned in the column direction, of a number corresponding to two or three bit lines. The sense amplifier/column decoder 14 selects a column of the memory cells that are included in the redundant cell array 12 when the selected bit line of the array 10 includes a defective memory cell. Further, there is provided a redundancy control circuit 15 on the memory chip in order to control the selection in the redundant cell arrays 11 and 12.

Conventionally, the semiconductor memory device having a storage capacity of about 1 Mbits has been constructed by employing the construction of FIG. 1. On the other hand, the construction of FIG. 1 causes a problem of increased parasitic capacitance when adopted for implementing semiconductor devices having a larger capacity, such as 4 Mbits, 16 Mbits, 64 Mbits or 256 Mbits, because of the excessive extension of the word lines WL and the bit lines BL. It should be noted that such an excessive length of the word lines WL or bit lines BL inevitably invites an increased parasitic capacitance, which in turn results in problems such as increased driving power, reduced access speed, etc. In order to solve the problem, it is common practice to construct large capacity memory devices by dividing the device into a number of memory blocks each having a size of about 1 Mbits.

Figure 2:
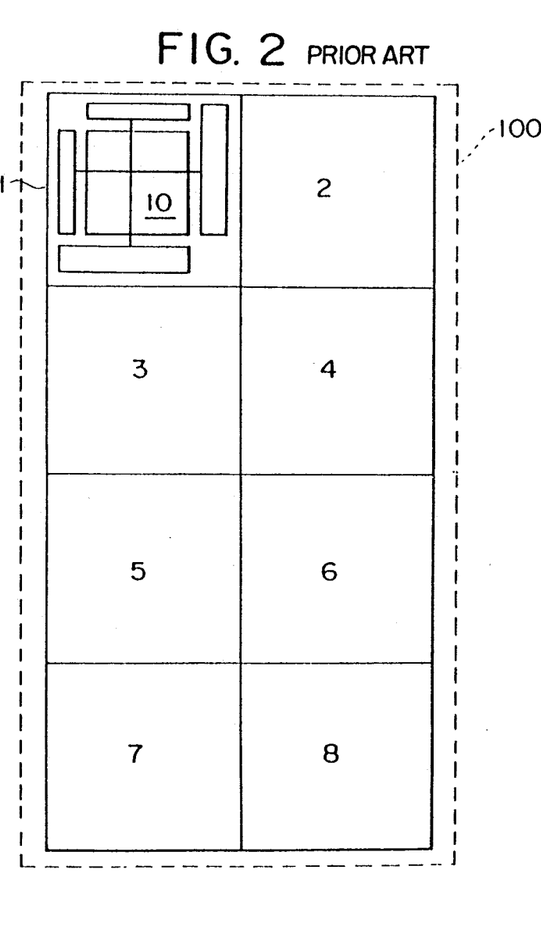
FIG. 2 is a diagram showing a conventional large scale semiconductor memory device wherein a plurality of blocks each having the construction of FIG. 1 are provided.

FIG. 2 shows an example of such a semiconductor memory device that has the block construction.

Referring to FIG. 2, the semiconductor memory device is constructed as a plurality of blocks 1-8 that are formed on a single chip 100. Thereby, each block such as a block 1 has a construction shown in FIG. 1. In order to select each block, there is provided a block selection circuit, not illustrated, and the block selection circuit selects one of the blocks such as the block 1 in response to the address data when accessed. In the block 1 thus selected, on the other hand, a memory cell is selected in response to the address data as already explained.

In the conventional semiconductor memory devices as shown in FIGS. 1 and 2, it should be noted that the redundant construction can compensate for the defects in the memory cell array only when such number of the defects corresponds to the number of the word lines or the number of the bit lines that are included in the associated redundant memory cell array 11 or 12. Thus, when a dust particle having a size exceeding two or three word lines or two or three bit lines has deposited on the memory cell array 10, the redundant construction is no longer effective in compensating for the defect. Of course, defects caused by larger dust particles may be compensated when the number of the memory cell lines in the redundant memory cell array is increased. However, such a construction requires a large number of redundant memory cells in each block, and the use of a large number of memory cells for the redundant memory cell array inevitably reduces the number of the memory cells included in the ordinary memory cell, particularly in the large scale memory device as shown in FIG. 2. In other words, such a construction causes a reduction in the efficiency of use of the memory cell.

Figure 3:
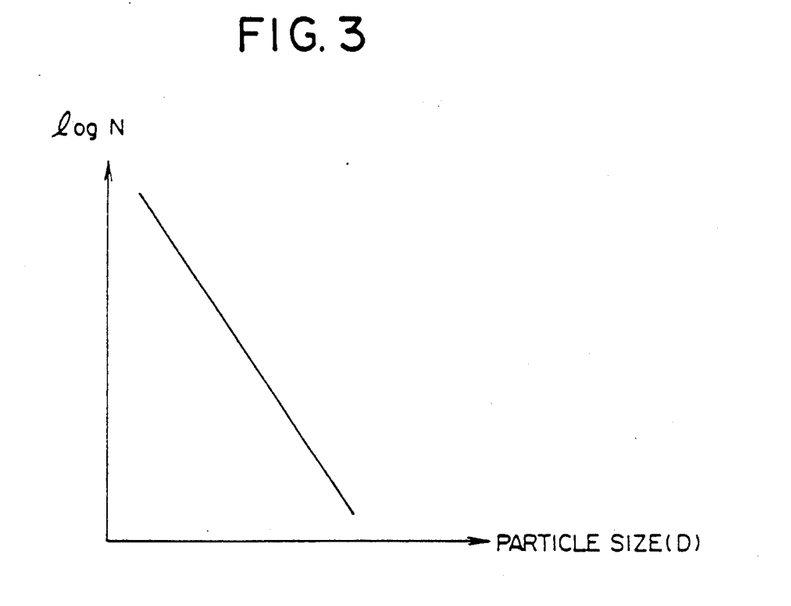
FIG. 3 is a diagram showing the relationship between the particle size and the probability of dust particles.

FIG. 3 shows a relationship between the particle size D and the density of distribution N of the dust particles on a semiconductor device. As illustrated, the probability of finding a dust particle decreases exponentially with the size D. On the other hand, it should be noted that the existence of a single dust particle having a size larger than several ten microns would make the memory device defective. When the size of the dust particles increases above several ten microns, the probability of the dust particles is negligible. However, the existence of the dust particles, of a size which corresponds to two or three memory cell rows in the memory cell array, is by no means negligible. As already noted, the redundant construction using the redundant memory cell arrays 11 and 12 in the block is not effective for the dust particles having a large size, and one has to devise a measure for eliminating the problem.

It should be noted further that the semiconductor memory device having the redundant construction as shown in FIG. 1 lacks the redundancy for the word decoder, sense amplifier/column decoder 14 and the control circuit 15. When a dust particle is deposited on these parts, the block becomes inevitably defective. Although these circuit elements occupy a smaller area of the block than the memory cell array, they nevertheless occupy a finite area. Particularly, in the large scale memory devices as shown in FIG. 2 that includes a plurality of blocks, the defects caused by the dust become a problem of real concern. It should be noted that the part of the circuit that does not have the redundancy is vulnerable not only to the dust particles having the size of 10 μm or more but also to submicron particles. Thereby, the probability of the defect increases significantly. See FIG. 3.

Figure 4:
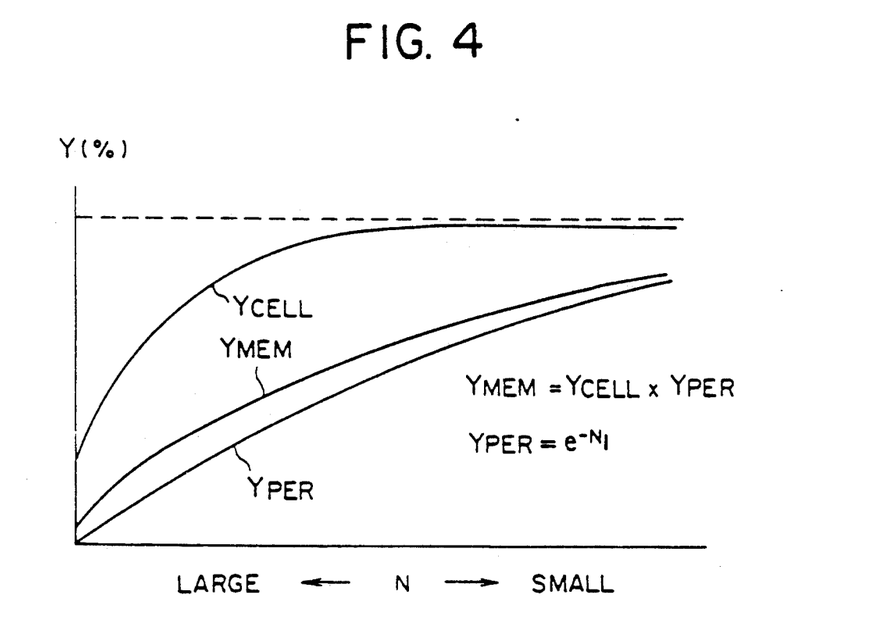
FIG. 4 is a diagram showing the relationship between the yield of a semiconductor device and the particle size.

FIG. 4 shows a relationship between the yield Y and the density of the defect N.

Referring to FIG. 4, the yield $Y_{MEM}$ of the memory device is represented as $$Y_{MEM} = Y_{CELL} \times Y_{PER}$$

where $Y_{CELL}$ represents the yield of the memory cell while $Y_{PER}$ represents the yield of the word decoder.

In the redundant construction that compensates for defects up to n bits, $Y_{CELL}$ is represented generally as $$Y_{CELL} = \sum_{i=0}^{n} \frac{N^i}{i!} \cdot e^{-N}$$

where N represents the probability of the defective memory cell.

On the other hand, $Y_{PER}$ is given generally as $$Y_{PER} = e^{-N_1}$$

where $N_1$ represents the probability of the defective memory cell. Since the respective device areas of the memory array 10 and of the peripheral circuits are different, the parameters N and $N_1$ are not necessarily identical.

FIG. 4 shows the improvement of the yield achieved in the memory cell array 10 by the redundant construction. This relationship simultaneously indicates that the yield of the memory device as a whole is lowered significantly by the yield of the peripheral circuit 15, such as the word decoder 13, that lacks the redundant construction. Since such a peripheral circuit is provided for each block, the yield of the memory device as a whole is decreased significantly, particularly in the memory devices having a number of blocks as shown in FIG. 2. In fact, the peripheral circuit occupies a significant area of the memory device of FIG. 2 in relation to the fact that there are a number of blocks included in the device. Thus, such a memory device is inevitably vulnerable to dust.

SUMMARY OF THE INVENTION

Accordingly, it is a general object of the present invention to provide a novel and useful semiconductor memory device wherein the foregoing problems are eliminated.

Another and more specific object of the present invention is to provide a semiconductor memory device comprising a plurality of memory blocks, each having a redundancy, wherein there is a provided a redundant construction that can compensate for those defects which the redundancy within the memory block cannot accommodate.

Another object of the present invention is to provide a semiconductor memory device comprising a plurality of main memory blocks each having a redundancy, and a redundant memory block that contains therein memory cell arrays, of a number which is identical with those of the main memory blocks, wherein said semiconductor memory device selects the redundant memory block when a selected memory block contains a defect that cannot be compensated for by the redundancy provided within said main memory block. According to the present invention, those defects that correspond to several word lines in the main memory block or those defects that cannot be compensated for by the redundancy inside the main memory block can be compensated for by selecting the defect-free redundant block in place of the selected main memory block.

DETAILED DESCRIPTION OF THE INVENTION

Figure 5:
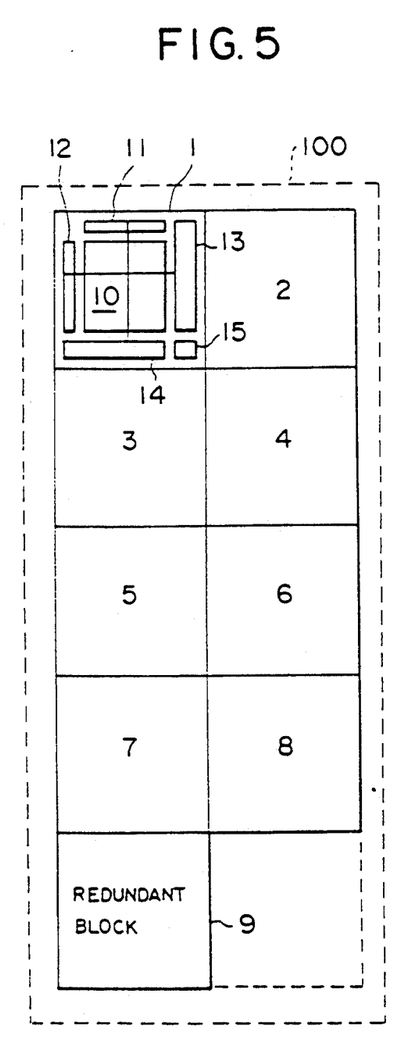
FIG. 5 is a diagram showing the layout of memory blocks in a semiconductor memory device according to a first embodiment of the present invention.

FIG. 5 is a schematic diagram showing the construction of a semiconductor memory device according to a first embodiment of the present invention.

Referring to FIG. 5, the semiconductor memory device according to the present invention has a basic construction as shown in FIG. 2, and thus includes a plurality of memory blocks 1-8. In each memory block, redundant memory cell arrays 11 and 12, as described previously with reference to FIG. 1, are provided. In the memory device of FIG. 5, a redundant block 9, having an identical construction with that of each memory block, is provided additionally on a chip 100. There, the redundant block 9 is selected in place of a selected block, such as the block 1, when there is a defect that cannot be compensated for by the redundancy inside the selected block. In order to achieve the selection of the redundant block, there is provided a block driver circuit that selects the redundant block when the selected block is defective, based upon the defective block memory circuit and address data.

Figure 6:
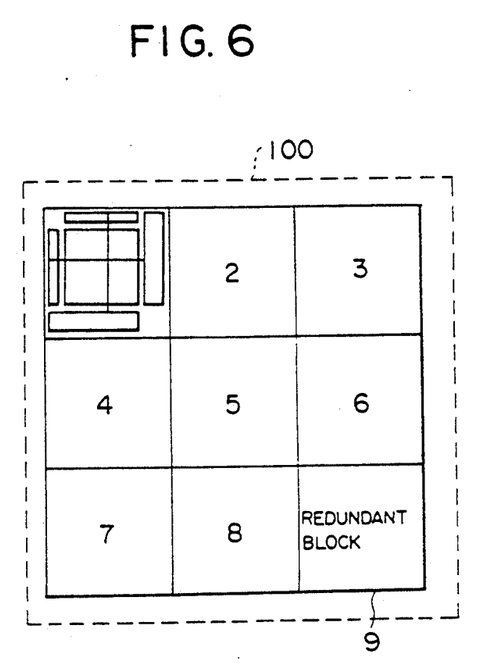
FIG. 6 is a diagram showing a modification of the layout of FIG. 5.

FIG. 6 shows a modification of the first embodiment, wherein the redundant block 9 is provided such that the blocks 1-9 generally form a square pattern. By arranging the blocks as such, one can minimize the area of the blocks formed on the chip 100. In the illustrated example, the redundant block 9 is provided such that two edges of the block 9 contact respective edges of two other, immediately adjacent blocks. However, the layout of the block 9 is of course not limited as such. For example, the block 9 may have three edges that contact respective edges of three other such adjacent blocks. Further, the block 9 may be surrounded entirely by other blocks, and thus at all four edges thereof.

Figure 7:
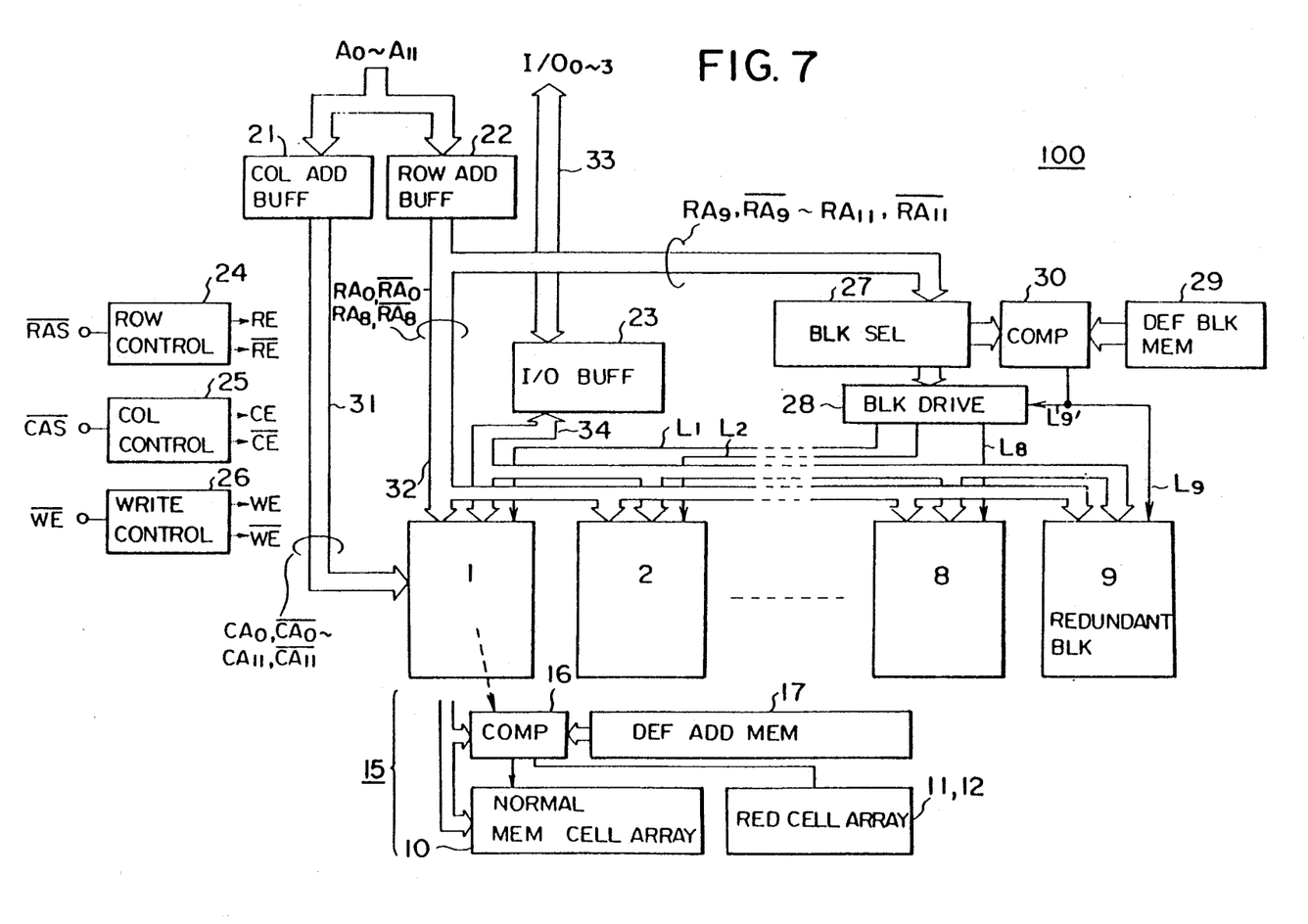
FIG. 7 is a block diagram showing the construction of the first embodiment of the present invention.

FIG. 7 is a block diagram showing an important part of the first embodiment shown in FIG. 5.

Referring to FIG. 7, the memory device according to the present embodiment of the present invention includes a column address buffer 21 supplied with external address data A0-A11 for producing complementary column address data CA0, $\overline{CA0}$,... CA, $\overline{CA11}$, and a row address buffer 22 supplied with the external address data A1-A11 for producing complementary row address data RA0, $\overline{RA0}$,... RA11, $\overline{RA11}$. The column address data CA0, $\overline{CA0}$,... CA11, $\overline{CA11}$ are supplied to each block 1-9 from the column address buffer 21 via a bus 31 and are used to select a word line in a selected block. On the other hand, the row address data RA0, $\overline{RA0}$,... RA8, $\overline{RA8}$, are supplied to each block 1-9 via a bus 32 and are used to select a bit line in the selected block.

Further, the chip 100 is formed with a four-bit data bus 33 and an I/O buffer 23 connected to the data bus 33, wherein the I/O buffer is connected to each memory 1-9 via another data bus 34 and performs the ordinary input/output operation in the selected block.

In the case that the semiconductor memory device is a DRAM, other circuits such as a row control circuit 24 supplied with a row address strobe signal $\overline{RAS}$ for producing complementary row selection enable signals RE and $\overline{RE}$, a column control circuit 25 supplied with a column address strobe signal $\overline{CAS}$ for producing complementary column selection enable signals CE and $\overline{CE}$, and a write control circuit 26 supplied with a write control signal $\overline{WE}$, for producing complementary write enable signals WE and $\overline{WE}$, are provided on the chip 100 as usual. Further, each block 1-9, and thus including the redundant block 9, is provided with a redundant control circuit 15 for controlling the ordinary memory cell array 10 as well as for controlling the redundant cell arrays 11 and 12 (i.e., as above in FIGS. 5 and 6) of each of the blocks 1 to 9. As is practiced commonly and as shown for block 1 in FIG. 7, the redundant control circuit 15 includes a defect address memory circuit 17 for storing the address of the defective cells in the block and a comparator circuit 16 that selects the redundant cell arrays 11 and 12 based upon the information stored in the defect address memory circuit 17.

In order to select a memory cell block from the plurality of memory cell blocks 1-8, the illustrated semiconductor memory device includes a block selection circuit 27 on the chip 100, wherein the block selection circuit 27 is supplied with the address data RA9, $\overline{RA9}$--RA11, $\overline{RA11}$, that are outputted from the row address buffer. Thereby, the block selection circuit 27 selects a desired block by activating a block drive circuit 28 that forms a part of the decoder. There, the block drive circuit supplies a block activation signal to a selected block via one of the lines L1-L8 in response to the address data RA9, $\overline{RA9}$-RA11, $\overline{RA11}$. For example, the block drive circuit 28 outputs a block activation signal for the block 1 on a line L1 when the values of the address data RA9, $\overline{RA9}$-RA11, $\overline{RA11}$ indicate the selection of the block 1.

In the present invention, there is provided a defective block memory circuit 29 for controlling the selection of the redundant blocks. More specifically, the defective block memory circuit 29 is implemented in the form of a ROM or a PROM and stores the addresses of the respective, defective blocks. In addition, there is provided a comparator circuit 30 that refers to the defective block memory circuit 29 based upon the block selection data RA9, $\overline{RA9}$-RA11, $\overline{RA11}$. There, the comparator circuit 30 activates the redundant block 9 by supplying an activation signal to the block 9 via a line L9 when the block that is selected by the block selection data is defective. Simultaneously, the activation signal is supplied to the block drive circuit 28 and deactivates the same. As a result, the redundant block 9 is selected and activated. Simultaneously, the ordinary blocks 1-8 are all deactivated. The selection of the memory cell as well as the reading and writing is achieved in the redundant block 9 based upon the row address data RA0, $\overline{RA0}$-RA8, $\overline{RA8}$ and the column address data CA0, $\overline{CA0}$-CA11, CA[8]11.

Next, the detailed construction of the defective block memory circuit and the comparator circuit 30 will be described with reference to the circuit diagram of FIG. 8.

Figure 8:
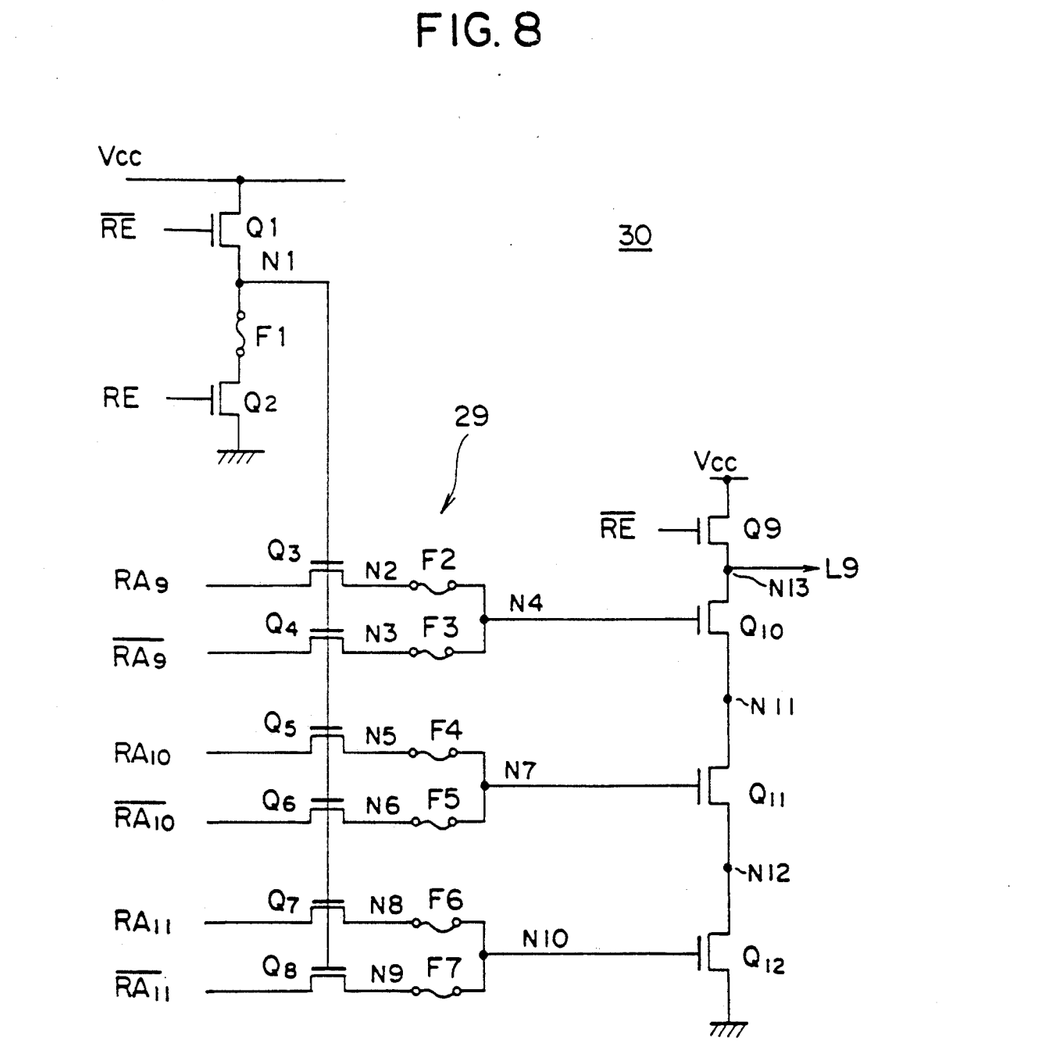
FIG. 8 is a circuit diagram showing an important part of FIG. 7.

Referring to FIG. 8, there is provided a fuse F1 that is disconnected when the redundant circuit is to be activated. When there is no defect and hence the redundant construction is not used, the fuse F1 is left as it is. Thus, when the data $\overline{RAS}$ has a level "L," the signal RE has a level "H" and the transistor Q1 is turned off while the transistor Q2 is turned ON. When the fuse F1 is not disconnected, the node "N1" has a level "L" and the transistors Q1-Q8 are all turned off. In other words, the circuit is deactivated.

When the fuse F1 is disconnected, on the other hand, the node N1 now has a level "H" and the transistors Q3-Q8 are turned on. Thereby, the circuit is activated. It should be noted the fuses F2 and F3 are used for storing one-bit data. When storing data "1," for example, the fuse F3 is disconnected. In response to this, the node N4 has the level "H" as represented by N4="H" provided that the level of the data RA9 is "H" ($\overline{RA9}$ is "L"). On the other hand, when the data RA9 has the level "L" ($\overline{RA\ 9}$="H"), the level at the node N4 becomes "L." In other words, the level of the node N4 becomes "L" only when the level of the data RA9 and $\overline{RA9}$ represent the logic value "1." When storing the data "0", on the other hand, the fuse F2 is disconnected. In this case, the level of the node N4 becomes zero only when the data RA9 and $\overline{RA9}$ represent that data "0." Thus, the level of the node N4 becomes "H" only when the address data agrees to the data that is stored. The above description applies also to the nodes N7 and N10.

The nodes N4, N7 and N10 are connected to the gates of the transistors Q10–Q12 that are connected in series. Thus, when the nodes N4, N7 and N10 all have a high level state "H," in other words, when all three address data coincide, the level of the node N13 becomes "L" and a signal L9' that corresponds to the logic inversion of the signal at the node N13 (see FIG. 8) becomes "H."

The fuses F2–F7 form the defective block memory circuit 29 shown in FIG. 7. Thus, by disconnecting the fuses F2–F7 in correspondence to the address of the defective blocks, one can activate the redundant block by the activation signal on the line L9 only when the address data RA9–$\overline{RA11}$ that specifies a defective memory block comes in. For example, when the defective block has a value (H, L, L, H, L, H) in correspondence to the address data (RA9, $\overline{RA9}$, $\overline{RA10}$, RA11, $\overline{RA11}$), one can obtain the desired activation signal on the line L9 by disconnecting the fuses except for the fuses F2, F5 and F7.

In the illustrated example, there are eight ordinary memory cell blocks. In correspondence to this, three-bit data RA9, RA9, RA9, $\overline{RA9}$, RA10, $\overline{RA10}$, RA11 and $\overline{RA11}$ is used for the block selection address data. Further, three transistors, Q10, Q11 and Q12, are used in correspondence to the use of the three-bit address data. The present invention, however, is by no means limited to such a construction but may be applicable to those devices wherein a larger number of blocks are included, with a larger number of bits used for the block selection signal.

Figure 9:
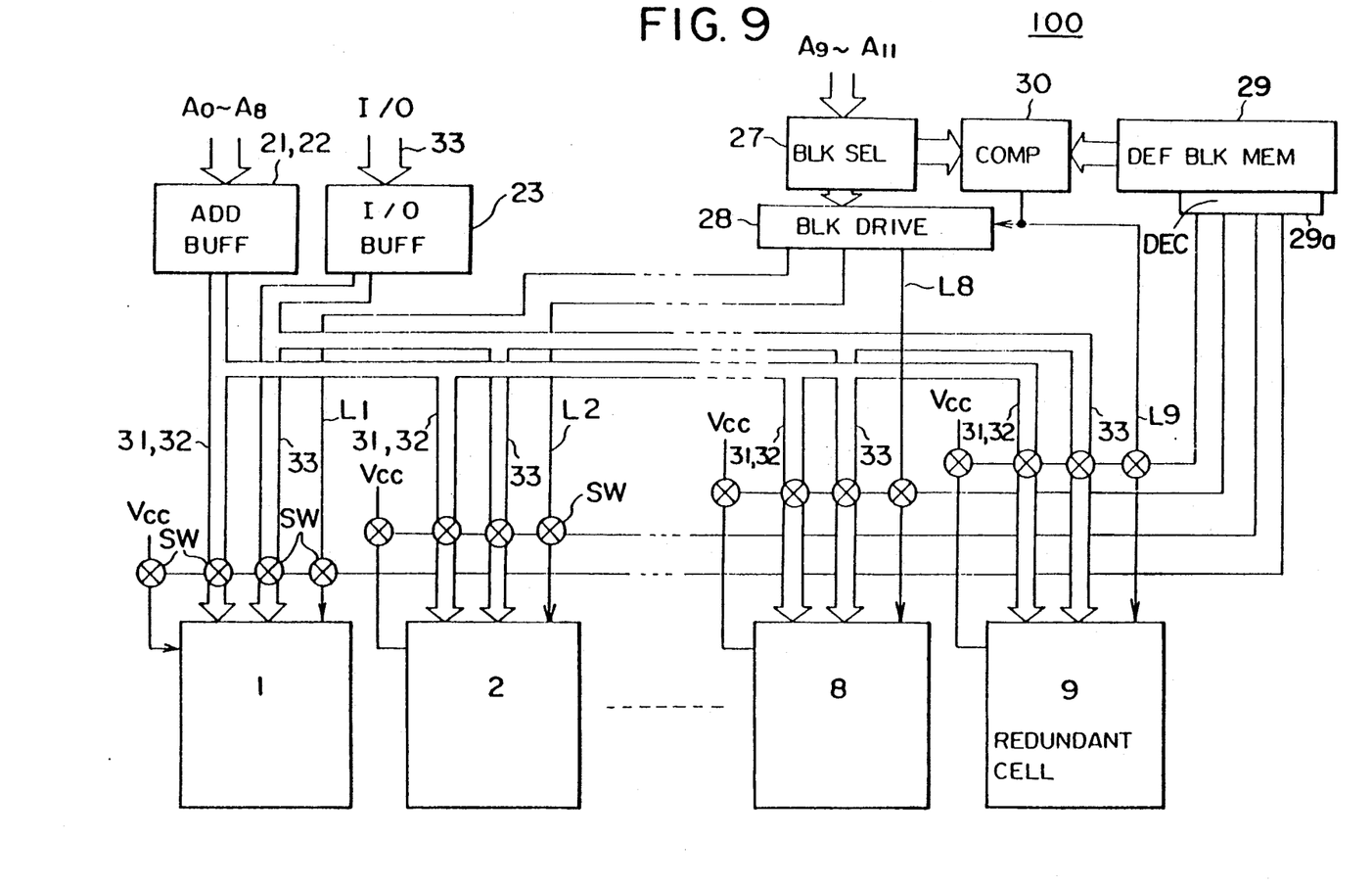
FIG. 9 is a block diagram showing the semiconductor memory device according to a second embodiment of the present invention.

Next, a second embodiment of the present invention will be described with reference to FIG. 9; therein, the address buffer 21 and the address buffer 22 are illustrated by a single block. Associated with this, the buses 31 and 32 are represented by a single bus. Further, the address buffers 21 and 22 are supplied with the address data $A_0$–$A_8$ while the block selection circuit 27 is supplied with the address data $A_9$–$A_{11}$.

In the present embodiment, the activation of the redundant memory cell block 9 is achieved by the defective block memory circuit 29 and the comparator circuit 30, similarly to the first embodiment. Simultaneously, there is provided a switch SW in each of the buses 31, 32 and 33 that extend to the respective memory cell blocks such that the switch SW disconnects the interconnections between the memory cell blocks 1–9 and the address buffers 21 and 22 or the interconnections between the memory cell blocks 1–9 and the I/O buffer 23. Such a switch SW is provided also in the line L1–L8 connecting the block drive circuit 28 and the memory cell blocks 1–8 as well as in the lines L1–L8 as well as in the line L9 that connects the comparator circuit 30 and the redundant memory cell block 9. Further, such a switch SW may be provided in each block for interrupting the power to the respective blocks.

Each switch SW is activated selectively in response to a corresponding output of the defective block memory circuit 29. The defective block memory circuit 29 is equipped with a decoder 29a that activates those switches SW that cooperate with the defective blocks, such that the supply of the power voltage $V_{CC}$ is interrupted and the defective block is disconnected from the address buffers 21 and 22 or from the I/O buffer 23. Thereby, the risk of the address buffer 21, 22 or the I/O buffer 23 functioning erroneously due to the short circuit in the defective memory block is effectively eliminated.

The decoder 29a is connected for example to the nodes N4, N7 and N10 (FIG. 8) and activates the switch SW of any of the blocks in response to the combination of the output voltages that appear on these nodes. For example, when the memory block 1 is defective, the switch SW that cooperates with the memory cell block 1 is activated simultaneously with the outputting of the activation signal on the line L9 for the activation of the redundant memory cell block. Thereby, the supply of the power to the memory cell block 1 is interrupted and the block 1 is disconnected from the address buffer 21, 22 or from the I/O buffer 23.

The present invention is not limited to the embodiments described heretofore, but various variations and modifications may be made without departing from the scope of the invention.

The present invention provides a semiconductor memory device, that includes a plurality of memory cell blocks formed on a chip, with a redundancy formed within each memory cell block. Further, the semiconductor memory device of the present invention includes a redundant block that is selected when an entire block becomes defective. Accordingly, the semiconductor memory device of the present invention can guarantee a normal operation of the semiconductor memory device even when large size defects, as large as several word lines and which could not be compensated for conventionally, have occurred or even when defects have occurred in the peripheral circuit parts of a block for which no redundancy is provided.

I claim:

1. A semiconductor memory device, comprising:
 a plurality of main memory blocks on a chip major surface, each block comprising a main memory cell array, peripheral circuit means supplied with first address data for addressing a memory cell in the main memory cell array, a sub-memory cell array that includes memory cells of a number smaller than said main memory cell array, first defect address memory means for storing address data of a defective memory cell that is included in said main memory cell array, first redundancy control means supplied with said first address data for selecting a memory cell in the sub-memory cell array in place of said defective memory cell when said first address data specifies said defective memory cell, and data input/output means for writing and/or reading data to and from said selected memory cell;
 block selection means supplied with second address data selectively activating one of said plurality of main memory blocks;
 second defect address memory means for storing address data of a defective main memory block that contains a defect that cannot be compensated for by said first redundancy control means;
 a redundant memory block provided on said chip major surface and having a construction substantially identical with each of said main memory blocks; and
 second redundancy control means supplied with said second address data for selecting said redundant memory block in place of said defective main memory block when said second address data specifies said defective main memory block that contains the defect.

2. A semiconductor memory device as claimed in claim 1 wherein each of said plurality of main memory blocks and said redundant memory block has four respective surrounding edges and each of at least two of said respective edges of said redundant memory block is in contact with a corresponding, respective said edge of an adjacent said main memory block.

3. A semiconductor memory device as claimed in claim 1, wherein:
   said second defect address memory means comprises bus means for transferring said second address data and fuse means provided in said bus means for prohibiting a transfer of a particular value of said second address data; and
   said second redundancy control means comprises a logic circuit that supplies a control signal for activating said redundant memory block in response to said second address data that is supplied via said fuse means.

4. A semiconductor memory device as claimed in claim 3 wherein said block selection means is deactivated in response to said control signal produced by said logic circuit.

5. A semiconductor memory device as claimed in claim 4, wherein:
   said bus means of said second defect address memory means comprises a plurality of complementary bus lines in pairs for transferring said second address data;
   said fuse means comprises respective fuses provided in said complementary bus lines; and
   in each pair of said complementary bus lines, the bus lines are connected commonly to form an input bus line that is connected to said logic circuit.

6. A semiconductor memory device as claimed in claim 5 wherein said second redundancy control means comprises a plurality of transistors connected in series between a power supply and a ground, each input bus line being connected to a gate of one of said transistors that corresponds to said input bus line.

7. A semiconductor memory device as claimed in claim 6, further comprising:
   decoding means supplied with said second address data for producing a control signal that specifies the defective memory block that contains the defect which cannot be compensated for by said first redundancy control means, based upon the address data of the defective memory block stored in said second defect address memory means; and
   switch means provided between said main memory blocks and a peripheral circuit that cooperates therewith, said switch means disconnecting an electric connection between said defective memory block and said peripheral circuit in response to said control signal from said decoding means.

8. A semiconductor memory device as claimed in claim 1, wherein said memory cell comprises a dynamic random access memory.

9. A semiconductor memory device as claimed in claim 1, wherein said redundant memory block is supplied with said first address data and said input/output data, in parallel with the supply thereof to said main memory blocks.

* * * * *

UNITED STATES PATENT AND TRADEMARK OFFICE
CERTIFICATE OF CORRECTION

PATENT NO. : 5,307,316
DATED : April 26, 1994
INVENTOR(S) : Yoshihiro TAKEMAE

It is certified that error appears in the above-indentified patent and that said Letters Patent is hereby corrected as shown below:

Col. 3, line 53, change " $Y_{PER}=e^{-N1}$ " to -- $Y_{PER}=e^{-N_1}$ --.

Col. 4, line 16, delete "a" (first occurrence).

Col. 6, line 43, change "CA[8]11" to -- $\overline{CA11}$ --.

Col. 7, line 24, after " $\overline{RA9}$, " insert --RA10,--.

Signed and Sealed this

Twenty-third Day of November, 1999

Attest:

Q. TODD DICKINSON

*Attesting Officer*  *Acting Commissioner of Patents and Trademarks*